(12) United States Patent
Suzuki (10) Patent No.: US 11,769,440 B2
(45) Date of Patent: Sep. 26, 2023

(54) DISPLAY DEVICE

(71) Applicant: KYOCERA Corporation, Kyoto (JP)

(72) Inventor: Takanobu Suzuki, Itami (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/802,114

(22) PCT Filed: Feb. 1, 2021

(86) PCT No.: PCT/JP2021/003583
§ 371 (c)(1),
(2) Date: Aug. 24, 2022

(87) PCT Pub. No.: WO2021/171921
PCT Pub. Date: Sep. 2, 2021

(65) Prior Publication Data
US 2023/0099833 A1   Mar. 30, 2023

(30) Foreign Application Priority Data
Feb. 27, 2020   (JP) .................. 2020-031920

(51) Int. Cl.
*G09G 3/00* (2006.01)
*G09G 3/20* (2006.01)
*G09G 3/32* (2016.01)
*G09G 3/3233* (2016.01)

(52) U.S. Cl.
CPC ............... *G09G 3/2074* (2013.01); *G09G 3/32* (2013.01); *G09G 3/3233* (2013.01); *G09G 2300/0426* (2013.01); *G09G 2300/0842* (2013.01); *G09G 2320/0276* (2013.01); *G09G 2320/0626* (2013.01); *G09G 2320/0666* (2013.01)

(58) Field of Classification Search
CPC ........... G09G 3/20; G09G 3/32; G09G 3/3233; G09G 5/18
See application file for complete search history.

(56) References Cited

U.S. PATENT DOCUMENTS

| | | | |
|---|---|---|---|
| 2003/0030603 A1 | 2/2003 | Shimoda | |
| 2004/0070557 A1 | 4/2004 | Asano et al. | |
| 2015/0170612 A1* | 6/2015 | Muguruma et al. | G09G 3/3685 345/82 |
| 2017/0316742 A1* | 11/2017 | Aoki | G09G 3/3275 |

FOREIGN PATENT DOCUMENTS

| | | |
|---|---|---|
| JP | 2003-58106 A | 2/2003 |
| JP | 2004-133240 A | 4/2004 |

* cited by examiner

*Primary Examiner* — Michael A Faragalla
(74) *Attorney, Agent, or Firm* — PROCOPIO CORY HARGREAVES AND SAVITCH LLP (57) ABSTRACT

A display device includes a matrix of pixel units each including a light-emitting element and a pixel circuit that causes the light-emitting element to emit light. The pixel circuit includes a first driver that drives the light-emitting element in response to the gradation value of an image in a range of gradation values less than or equal to a first boundary value and does not drive the light-emitting element in response to the image gradation value in a range of gradation values greater than the first boundary value, and a second driver that does not drive the light-emitting element in response to the image gradation value in a range of gradation values less than or equal to a second boundary value and drives the light-emitting element in response to the image gradation value in a range of gradation values greater than the second boundary value.

20 Claims, 6 Drawing Sheets

DISPLAY DEVICE

TECHNICAL FIELD

The present disclosure relates to a display device including a matrix of pixel units including self-luminous light-emitting elements such as LEDs (light-emitting diodes) or organic EL (electroluminescence) elements. Image data is written to each of the pixel units using selection signals and light emission signals to display high resolution images with a high contrast ratio.

BACKGROUND OF INVENTION

Known display devices are described in, for example, Patent Literatures 1 and 2.

Citation List

Patent Literature

Patent Literature 1: Japanese Unexamined Patent Application Publication No. 2003-058106
Patent Literature 2: Japanese Unexamined Patent Application Publication No. 2004-133240

SUMMARY

In an aspect of the present disclosure, a display device includes a plurality of pixel units arranged in a matrix. Each pixel unit of the plurality of pixel units includes a light-emitting element and a pixel circuit. The light-emitting element has luminance changeable in accordance with a magnitude of a current and an input period of the current. The pixel circuit causes the light-emitting element to emit light with luminance corresponding to a gradation value obtained from an image signal. The pixel circuit includes a first driver and a second driver. The first driver drives the light-emitting element in response to the gradation value from the image signal being in a range of gradation values less than or equal to a first boundary value, and does not drive the light-emitting element in response to the gradation value from the image signal being in a range of gradation values greater than the first boundary value. The second driver does not drive the light-emitting element in response to the gradation value from the image signal being in a range of gradation values less than or equal to a second boundary value that is less than the first boundary value and drives the light-emitting element in response to the gradation value from the image signal being in a range of gradation values greater than the second boundary value.

BRIEF DESCRIPTION OF THE DRAWINGS

The objects, features, and advantages of the present disclosure will become more apparent from the following detailed description and the drawings.

DESCRIPTION OF EMBODIMENTS

A display device with the structure that forms the basis of a display device according to one or more embodiments of the present disclosure will now be described.

The display device with the structure that forms the basis of the display device according to one or more embodiments of the present disclosure includes a matrix of n $\times$ m (n is the number of rows, m is the number of columns, and n and m are positive integers) pixel units, n gate signal lines, m source signal lines, a gate signal line drive circuit, and a source signal line drive circuit. Pixel units that are in a selected state with gate signals (pixel selection signals) provided from the gate signal line drive circuit through the n gate signal lines receive source signals (image signals) provided from the source signal line drive circuit through the m source signal lines.

Each pixel unit includes a pixel circuit as a light emission controller including TFTs (thin-film transistors). Through the pixel circuits, light emission control signals transmitted through n light emission control signal lines arranged parallel to the gate signal lines are provided to the light-emitting elements. The light emission control signals are used to adjust the luminance of the entire display region and to control the on-off states of the display. A gate signal line, a source signal line, and a light emission control signal line are assigned to each pixel unit.

Each pixel unit described above includes a light-emitting element and a light emission controller. The light emission controller includes a light emission control element that controls the on-off of states of the light-emitting element using a light emission control signal, a switching element including a TFT for inputting a source signal into a drive element, the drive element including a TFT connected to the switching element and controlling the light emission intensity of the light-emitting element, and a retentive capacitance for retaining the voltage of the source signal input into the gate electrode of the drive element during a period (one frame period) until the next writing of data. The gate electrode of the drive element is connected to the drain electrode of the switching element, the source electrode of the drive element is connected to a positive power supply voltage signal line (a signal line VDD), the drain electrode of the drive element is connected to the source electrode of the light emission control element, and the drain electrode of the light emission control element is connected to the positive electrode of the light emission element. The negative electrode of the light-emitting element is connected to a negative supply voltage signal line (a signal line VSS).

The light-emitting element includes a self-luminous element, such as an LED (light-emitting diode) element or an organic EL (electroluminescence) element, that emits light with luminance corresponding to the magnitude of a current flowing from the anode to the cathode. A source signal (an image signal) from the source signal line is input into the gate electrode of the drive element during an active period of the gate signal line connected to the gate electrode of the switching element, and a drain current of the drive element flowing to the light-emitting element is controlled in accordance with the gate voltage of the drive element. The light emission intensity of the light-emitting element is controlled in accordance with the drain current to express gradations.

The above known techniques in Patent Literatures 1 and 2 use gradation control performed simply with a current flowing to the light-emitting elements, with which light-emitting elements in a low-gradation region are driven at a low current. The light-emitting elements such as LEDs may degrade the display quality due to too low light emission efficiency in a low current range and large variations in the characteristics such as changes in light emission chromaticity (emission wavelength). This is noticeable, particularly when a high contrast ratio is targeted.

The above known techniques in Patent Literatures 1 and 2 use gradation control performed simply with a current flowing to the light-emitting elements, with which the light-emitting elements are driven at a low current in a low-gradation region and at a high current in a high-gradation region, thus increasing the setting range of the current flowing to the light-emitting elements. In the low-gradation region, in particular, the drive elements are to control at a fine current, thus deteriorating the reproducibility of gradations. When the chromaticity (emission wavelength) of the light-emitting elements such as LEDs has current dependence, the light emission chromaticity shifts between the maximum graduation value and the minimum gradation value, deteriorating the reproducibility of the chromaticity. In contrast, a known drive method may control the gradations by combining multiple pulses and LED current values during different periods to narrow the setting range of the current flowing to the light-emitting elements. For the gradations at the boundary between a low-gradation value and a high-gradation value, the current flowing to the light-emitting elements changes discontinuously from a high current to a low current. When the emission wavelength of an LED has current dependence, the emission wavelength of the LED changes discontinuously, thus causing a noticeable shift in the light emission chromaticity. The display quality may deteriorate, particularly when a high definition image intended for a high contrast ratio is displayed.

In particular, the light emission luminance of an LED is proportional to the integral value of an LED current input into the LED with time during a predetermined period such as a frame period. For example, to achieve the contrast ratio of 10000:1, which is the luminance ratio of the maximum and minimum gradation values, the integral value of the LED current with time is to be controlled in the range of 1 to 0.0001 when the maximum light emission luminance is normalized to 1. When the light emission luminance (gradations) of the LED is controlled simply with the LED current, the setting range of the LED current can be as wide as 1 to 0.0001. This is undesirable for the LED to be used in a low current region in which the light emission efficiency is too low. This tendency is more noticeable when a higher contrast ratio is targeted. In contrast, a drive method for controlling gradations by combining multiple pulses and LED current values during different periods allows the setting range of the LED current value to be as narrow as 1 to 0.01 to achieve the above contrast ratio of 10000:1 under control with, for example, two different pulses. However, the light emission chromaticity of the LED elements has characteristics that vary depending on the LED current value. When the gradations are controlled by combining multiple pulses and LED current values during different periods, the current flowing to the LED elements changes discontinuously and greatly in the gradation at the boundary of the drive with multiple pulses. The emission wavelength of the LED elements changes discontinuously when the emission wavelength of the LED elements has current dependence.

One or more embodiments of the present disclosure will now be described in detail with reference to the drawings.

Figure 1:
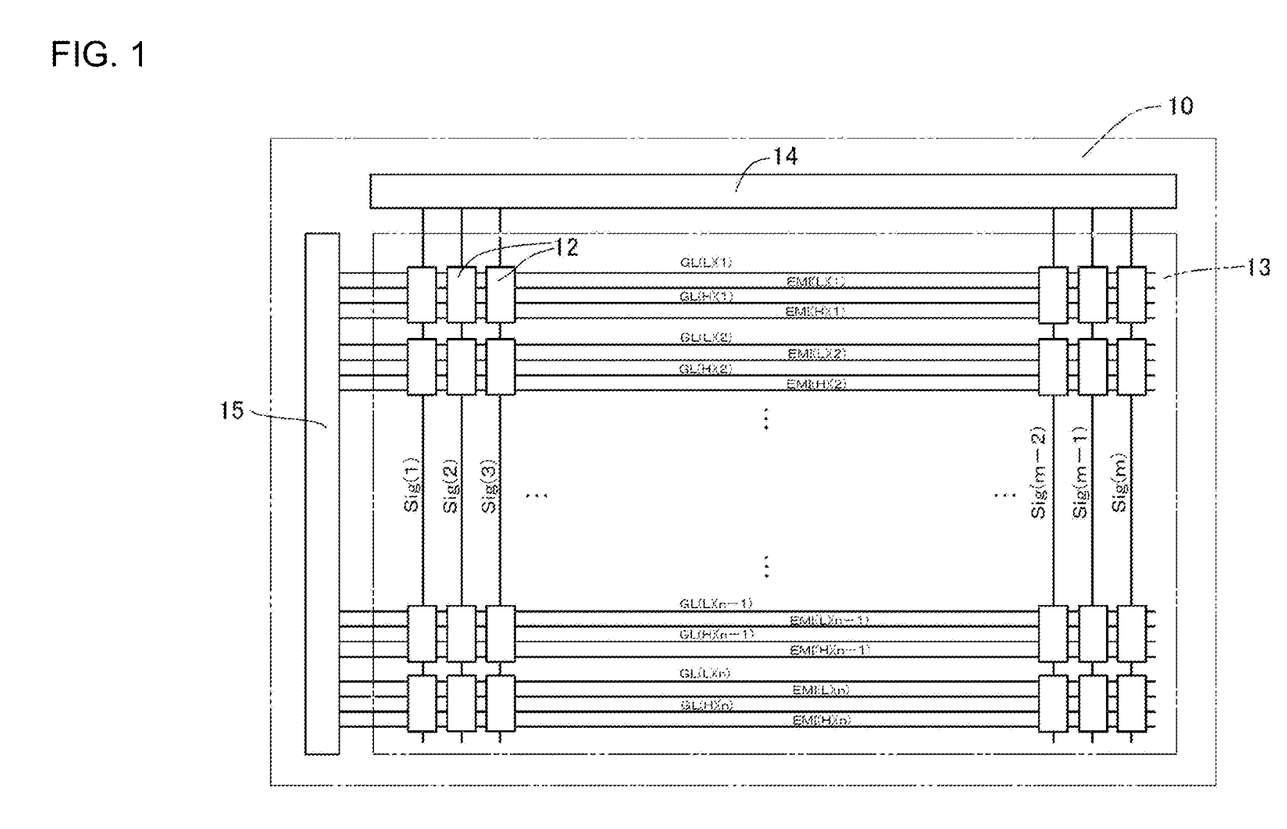
FIG. 1 is an electrical circuit diagram of a display device according to one embodiment of the present disclosure illustrating its schematic configuration.
Figure 2:
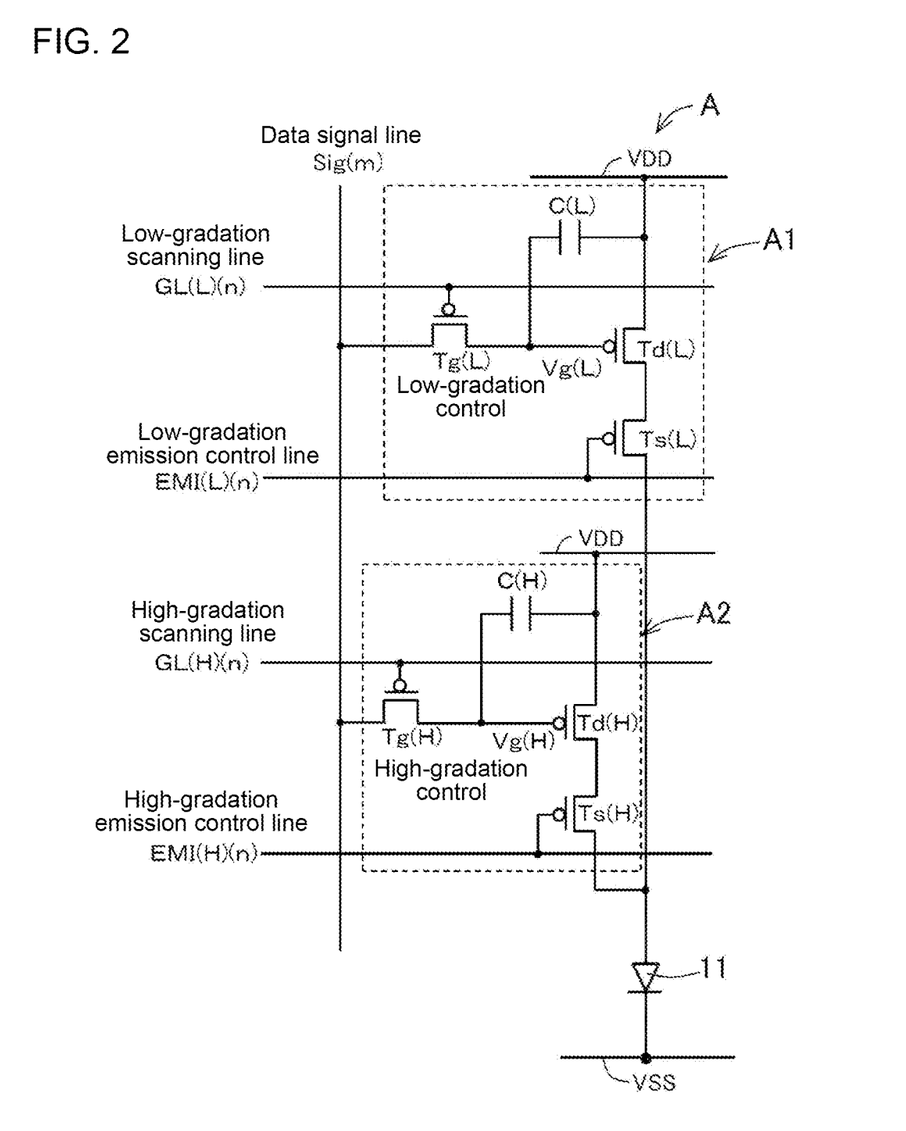
FIG. 2 is an electrical circuit diagram of a pixel unit in the display device illustrated in FIG. 1.

FIG. 1 is an electrical circuit diagram of a display device according to one embodiment of the present disclosure illustrating its schematic configuration. FIG. 2 is an electrical circuit diagram of a pixel unit in the display device illustrated in FIG. 1. For ease of illustration, FIG. 1 does not illustrate a first power supply line VDD and a second power supply line VSS. A display device 10 according to the present embodiment includes self-luminous light-emitting elements 11 with luminance that changes depending on magnitude and an input period of the current. A display screen 13 includes multiple (= n × m) pixel units 12 arranged in a matrix of n rows × m columns (where n and m are positive integers).

Figure 3:
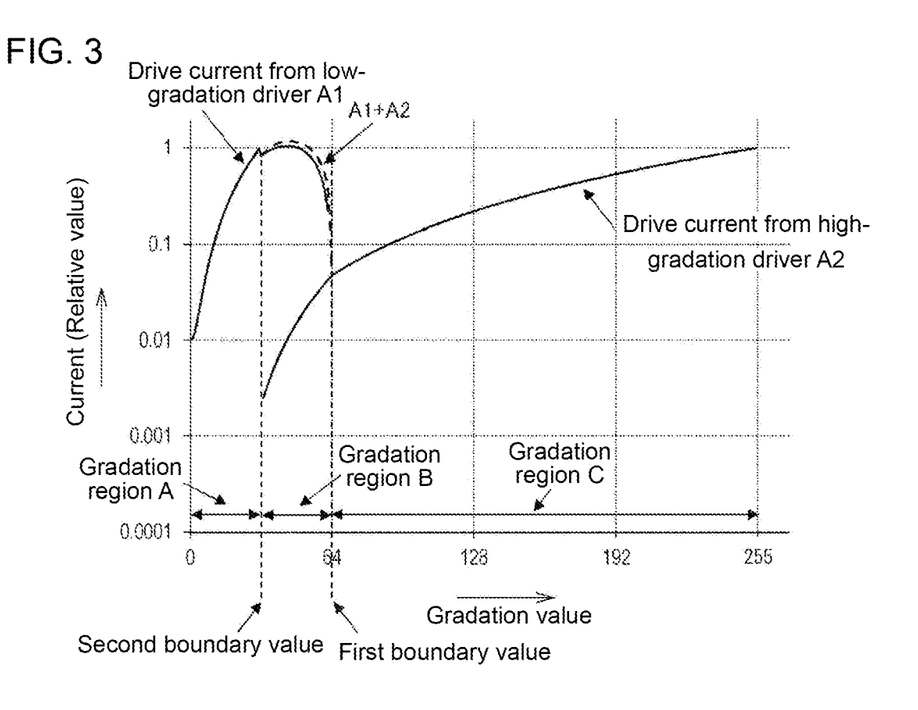
FIG. 3 is a graph showing the relationship between a current input into a light-emitting element and a gradation value before combining.
Figure 4:
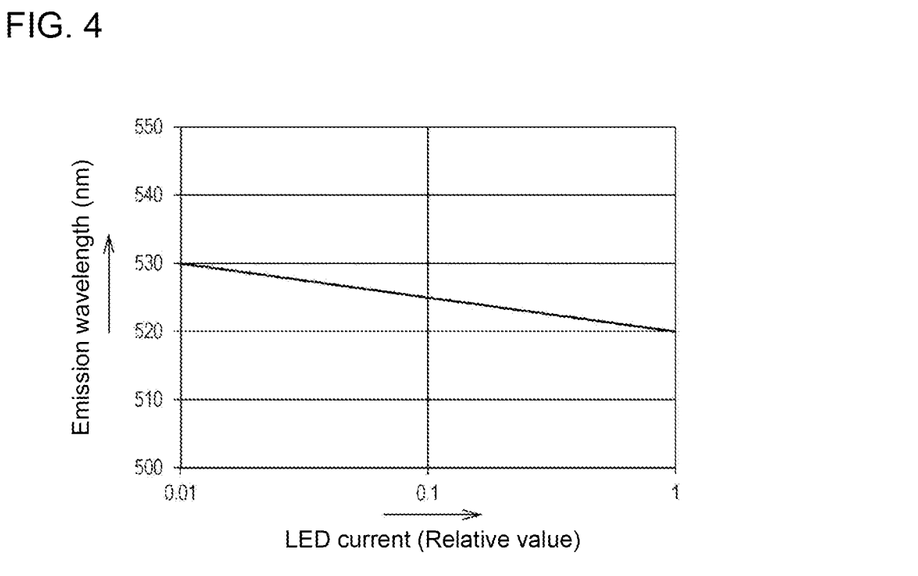
FIG. 4 is a graph showing the relationship between a current input into a light-emitting element and the emission wavelength of the light-emitting element.

The display device 10 includes pixel circuits A (illustrated in FIG. 2) that switch and select the drive from each low-gradation driver (a first driver) and each high-gradation driver (a second driver) to cause the light-emitting element to emit light based on the gradation value obtained from an image signal as shown in FIG. 3 (described later) in response to the image signal input from an external device.

As illustrated in FIGS. 2 and 3, the pixel circuit A includes a low-gradation driver A1 and a high-gradation driver A2. The low-gradation driver A1 drives the light-emitting element 11 in response to the gradation value obtained from the image signal being in the range of gradation values less than or equal to a first boundary value and does not drive the light-emitting element 11 in response to the gradation value obtained from the image signal being in the range of gradation values greater than the first boundary value. The high-gradation driver A2 does not drive the light-emitting elements 11 in response to the gradation value obtained from the image signal being in the range of gradation values less than or equal to a second boundary value that is less than the first boundary value and drives the light-emitting element 11 in response to the gradation value obtained from the image signal being in the range of gradation values greater than the second boundary value. These low- and high-gradation drivers A1 and A2 are selected and driven independently of each other.

The display device 10 includes m data signal lines Sig (1) to (m), which are collectively referred to as data signal lines Sig, arranged for each column in a matrix of multiple pixel units 12, n low-gradation scanning lines GL (L) (1) to (n), which are collectively referred to as low-gradation scanning lines GL (L), arranged for each row in a matrix, high-gradation scanning lines GL (H) (1) to (n), which are collectively referred to as high-gradation scanning lines GL (H), arranged for the each row in a matrix, low-gradation emission control lines EMI (L) (1) to (n), which are collectively referred to as low-gradation emission control lines EMI (L), arranged for the each row in the matrix, high-gradation emission control lines EMI (H) (1) to (n), which are collectively referred to as high-gradation emission control lines EMI (H), arranged for the each row in a matrix, a signal line drive circuit 14 that outputs image signals to the data signal lines Sig, a scanning line drive circuit 15 that outputs selection signals to the low-gradation scanning lines GL (L) and the high-gradation scanning lines GL (H), a first power supply line VDD to receive power supply power, and a second power supply line VSS with a potential different from the potential of the first power supply line VDD (for example, a predetermined positive potential) such as a predetermined negative potential or a ground potential. When the second power supply line VSS has the ground potential, the pixel circuit A and its peripheral circuit operate at substantially one potential (the positive potential). This easily simplifies the circuit configuration.

In the present embodiment, the signal line drive circuit 14 has the light emission period duty ratio for each frame of the light emission control signal set to cause all the gradation values to be 0 to 255, the predetermined first boundary value to be the gradation of 64, and the predetermined second boundary value to be the gradation of 32. These boundary values are examples and are set appropriately in accordance with the gradation intended for an image signal based on the specifications of the display device, such as a contrast ratio.

All the gradation values are 0 to 255, and the number of gradation values is 256. The maximum gradation value may thus be 255 with respect to 0, or may be 256.

In the present embodiment, in response to the gradation value obtained from an image signal being in the range of gradation values less than or equal to the second boundary value, the low-gradation driver A1 may drive the light-emitting element 11 with a first current pulse, and in response to the gradation value obtained from the image signal being in the range of gradation values greater than the second boundary value and less than or equal to the first boundary value, the low-gradation driver A1 may drive the light-emitting element 11 with a second current pulse, and the high-gradation driver A2 may drive the light-emitting element 11 with a third current pulse (a third current pulse following the second current pulse at a time interval) in a time-divided manner with the second current pulse, and in response to the gradation value obtained from the image signal being in the range of gradation values greater than the first boundary value, the high-gradation driver A2 may drive the light-emitting element 11 with a fourth current pulse. The integral value (IGm) of the current value input into the light-emitting element 11 with respect to the input period of the current value when the gradation value obtained from the image signal is in the range of gradation values greater than the second boundary value and less than or equal to the first boundary value (the intermediate-gradation range) can be adjusted to an intermediate value between the integral value (IGl) of the current value with respect to the input period of the current in the low-gradation drive when the gradation value is less than or equal to the second boundary value and the integral value (IGh) of the current value with respect to the input period of the current in the high-gradation drive when the gradation value is greater than the first boundary value (IGl > IGm > IGh). In addition, a composite drive signal of the drive signals from both the low- and high-gradation drivers A1 and A2 easily reduces discontinuous changes in the emission wavelength caused by discontinuous changes in the current flowing to the light-emitting elements near the boundary between the low-gradation region and the high-gradation region.

Each pixel unit 12 includes a low-gradation scanning transistor Tg (L) with a gate terminal connected to the low-gradation scanning line GL (L) and with a source terminal connected to the data signal line Sig, a high-gradation scanning transistor Tg (H) with a gate terminal connected to the high-gradation scanning lines GL (H) and with a source terminal connected to the data signal line Sig, a low-gradation capacitor C (L) with one terminal connected to a drain terminal of the low-gradation scanning transistor Tg (L) and the other terminal connected to the first power supply line VDD, a high-gradation capacitor C (H) with one terminal connected to a drain terminal of the high-gradation scanning transistor Tg (H) and the other terminal connected to the first power supply line VDD, a low-gradation drive transistor Td (L) with a gate terminal connected to one terminal of the low-gradation capacitor C (L) and with a source terminal connected to the first power supply line VDD, a high-gradation drive transistor Td (H) with a gate terminal connected to the terminal of the high-gradation capacitor C (H) and with a source terminal connected to the first power supply line VDD, a low-gradation emission control transistor Ts (L) with a gate terminal connected to the low-gradation emission control line EMI (L), with a drain terminal connected to an anode electrode of the light-emitting element 11, and with a source terminal connected to a drain terminal of the low-gradation drive transistor Td (L), and a high-gradation emission control transistor Ts (H) with a gate terminal connected to the high-gradation emission control lines EMI (H), with a drain terminal connected to the anode electrode of the light-emitting element 11, and with a source terminal connected to a drain terminal of the high-gradation drive transistor Td (H).

As described above, the low-gradation driver A1 includes the low-gradation scanning transistor Tg (L) with the gate terminal connected to the low-gradation scanning line GL (L) and with the source terminal connected to the data signal line Sig, the low-gradation capacitor C (L) with one terminal connected to the drain terminal of the low-gradation scanning transistor Tg (L) and the other terminal connected to the first power supply line VDD, the low-gradation drive transistor Td (L) with the gate terminal connected to one terminal of the low-gradation capacitor C (L) and with the source terminal connected to the first power supply line VDD, and the low-gradation emission control transistor Ts (L) with the gate terminal connected to the low-gradation emission control line EMI (L), with the drain terminal connected to the anode electrode of the light-emitting element 11, and with the source terminal connected to the drain terminal of the low-gradation drive transistor Td (L).

The high-gradation driver A2 includes the high-gradation scanning transistor Tg (H) with the gate terminal connected to the high-gradation scanning line GL (H) and with the source terminal connected to the data signal line Sig, the high-gradation capacitor C (H) with one terminal connected to the drain terminal of the high-gradation scanning transistor Tg (H) and the other terminal connected to the first power supply line VDD, the high-gradation drive transistor Td (H) with the gate terminal connected to one terminal of the high-gradation capacitor C (H) and with the source terminal connected to the first power supply line VDD, and the high-gradation emission control transistor Ts (H) with the gate terminal connected to the high-gradation emission control line EMI (H), with the drain terminal connected to the anode electrode of the light-emitting element 11, and with the source terminal connected to the drain terminal of the high-gradation drive transistor Td (H).

The light-emitting element 11 is connected in series between the drain terminal of the low-gradation emission control transistor Ts (L) and the second power supply line VSS and between the drain terminal of the high-gradation emission control transistor Ts (H) and the second power supply line VSS. In other words, the anode electrode of the light-emitting element 11 is connected in parallel to the drain terminals of the low- and high-gradation emission control transistors Ts (L) and Ts (H). A cathode electrode of the light-emitting element 11 is connected to the second power supply line VSS. Each pixel unit 12 includes the light-emitting element 11 and the above pixel circuit A.

A positive power supply voltage of, for example, about +3 V is applied to the first power supply line VDD, and a power supply voltage with the ground potential (about 0 V) or a negative potential, for example, about -3 V to -5 V, which is less than the voltage of the first power supply line VDD, is applied to the second power supply line VSS. For example, when the potential difference between the voltage of the first power supply line VDD and the voltage of the second power supply line VSS is 8 V, the voltage of the second power supply line VSS is -5 V when the voltage of the first power supply line VDD is 3 V, and the voltage of the second power supply line VSS is 0 V when the voltage of the first power supply line VDD is 8 V.

The low-gradation scanning transistor Tg (L), the high-gradation scanning transistor Tg (H), the low-gradation drive transistor Td (L), the high-gradation drive transistor Td (H), the low-gradation emission control transistor Ts (L), and the high-gradation emission control transistor Ts (LH) described above can be implemented by a p-channel TFT. In response to a low signal (an L signal) input into each gate electrode, each transistor can be conductive between the source and the drain and is turned on to allow a current to flow.

The TFT is a three-terminal device with a semiconductor film of, for example, amorphous silicon (a-Si) or an LTPS (low temperature polysilicon), and includes a gate electrode at its gate terminal, a source electrode at its source terminal, and a drain electrode at its drain terminal. Applying a voltage of a predetermined potential to the gate electrode causes a current to flow through a semiconductor film (a channel) between the source electrode and the drain electrode. The TFT thus functions as a switching element (a gate transfer element).

The low- and high-gradation emission control transistors Ts (L) and Ts (H) receive, at their gate electrodes, light emission control signals for controlling the light emission period from the emission control lines EMI (L) and EMI (H). The drive currents from the low- and high-gradation drive transistors Td (L) and Td (H) are supplied to the light-emitting element 11 during the active period of the input light emission control signal.

The low-gradation capacitor C (L), which is a capacitive element, is connected in parallel between the gate terminal and the source terminal of the low-gradation drive transistor Td (L). The high-gradation capacitor C (H), which is a capacitive element, is connected in parallel between the gate terminal and the source terminal of the high-gradation drive transistor Td (H). The low-gradation capacitor C (L) functions as a retentive capacitance to retain the voltage of an image signal input into the gate terminal of the low-gradation drive transistor Td (L) during the period until the next writing of data (during the period of one frame). The high-gradation capacitor C (H) functions as a retentive capacitance to retain the voltage of the image signal input into the gate terminal of the high-gradation drive transistor Td (H) during the period until the next writing of data (during the period of the one frame).

Image data signals are transmitted from the signal line drive circuit 14 to each pixel unit 12 through the data signal lines Sig. Scanning signals are transmitted from the scanning line drive circuit 15 to each pixel unit 12 through the scanning lines GL (L) and GL (H). Light emission control signals are transmitted from the scanning line drive circuit 15 to each pixel unit 12 through the emission control lines EMI (L) and EMI (H).

The light-emitting element 11 may be any self-luminous LED such as a microchip LED, a monolithic LED, an organic EL, an inorganic EL, or a semiconductor laser element.

Each pixel unit 12 may include a red light emission subpixel, a green light emission subpixel, and a blue light emission subpixel. The red light emission subpixel includes a red light-emitting element including a red LED. The green light emission subpixel includes a green light-emitting element including a green LED. The blue light emission subpixel includes a blue light-emitting element including a blue LED. For example, these subpixels may be arranged in columns or in rows.

FIG. 3 is a graph showing the relationship between a drive current from the low-gradation driver A1 and a drive current from the high-gradation driver A2 versus the gradation value of the light-emitting element 11. In the figure, the vertical axis indicates the current (the relative value, or the relative value when the maximum value is normalized to 1) flowing to the light-emitting element 11, and the horizontal axis indicates the gradation value from 0 to 255. The drive current input from the low-gradation driver A1 into the light-emitting element 11 and the drive current input from the high-gradation driver A2 into the light-emitting element 11 are set based on the relationship between the drive current and the light emission luminance of the light-emitting element 11 and the relationship between the gradation value set based on the input and output characteristics of the display device and the current flowing to the light-emitting element 11. In the low-gradation region in which the gradation value is less than or equal to the second boundary value, the drive current is supplied to the light-emitting element 11 simply from the low-gradation driver A1, and the current value increases as the gradation value increases. In the gradation region in which the gradation value is greater than the second boundary value and less than or equal to the first boundary value, the drive currents are supplied from the low-gradation driver A1 and the high-gradation driver A2. In other words, the drive current from the low-gradation driver A1 decreases as the gradation value increases, and the drive current from the high-gradation driver A2 increases as the gradation value increases. In the high-gradation region in which the gradation value is greater than the first boundary value, the drive current is supplied to the light-emitting element 11 simply from the high-gradation driver A2, and the current value increases as the gradation value increases.

In response to the gradation value obtained from the image signal being in the low-gradation region in which the gradation value is less than or equal to the second boundary value, the drive current is supplied simply from the low-gradation driver A1, and the first current pulse input from the low-gradation driver A1 into the light-emitting element 11 has a short input period (about several microseconds to several hundred microseconds), and the wave height value (the current level) increases as the gradation value increases. The integral value of the first current pulse with time during the one frame period also increases as the gradation value increases.

In response to the gradation value obtained from the image signal being in the high-gradation region in which the gradation value is greater than the first boundary value, the drive current is supplied to the light-emitting element 11 simply from the high-gradation driver A2, and the fourth current pulse input from the high-gradation driver A2 into the light-emitting element 11 has a long input period (about several milliseconds to several ten milliseconds), and the wave height value increases as the gradation value increases. The integral value of the fourth current pulse with time during the one frame period also increases as the gradation value increases.

In response to the gradation value obtained from the image signal being in the intermediate-gradation region in which the gradation value is greater than the second boundary value and less than or equal to the first boundary value, the drive currents are supplied to the light-emitting element 11 from the low- and high-gradation drivers A1 and A2. In other words, the second current pulse input from the low-gradation driver A1 into the light-emitting element 11 has the same input period (e.g., the duty ratio during the one frame period) as the first current pulse, and the wave height value decreases as the gradation value increases. The third current pulse input from the high-gradation driver A2 into the light-emitting element 11 has the same input period as the fourth current pulse, and the wave height value increases as the gradation value increases. The sum of the integral value of the second current pulse with time and the integral value of the third current pulse with time during the one frame period also increases as the gradation value increases, and at the second and first boundary values, smoothly connects with the integral value of the current pulses with time in the gradation values before and after those boundary values.

In the intermediate-gradation region in which the gradation value is greater than the second boundary value and less than or equal to the first boundary value, the drive current from the low-gradation driver A1 decreases as the gradation value increases, whereas the drive current from the high-gradation driver A2 increases as the gradation value increases. This can reduce discontinuous changes in the drive current in the intermediate-gradation region corresponding to the switching region between the drive by the low-gradation driver A1 and the drive by the high-gradation driver A2 as indicated by the dashed line in FIG. 3. The discontinuous changes in the emission wavelength near the boundary between the low-gradation and high-gradation regions can be thus reduced.

Figure 6:
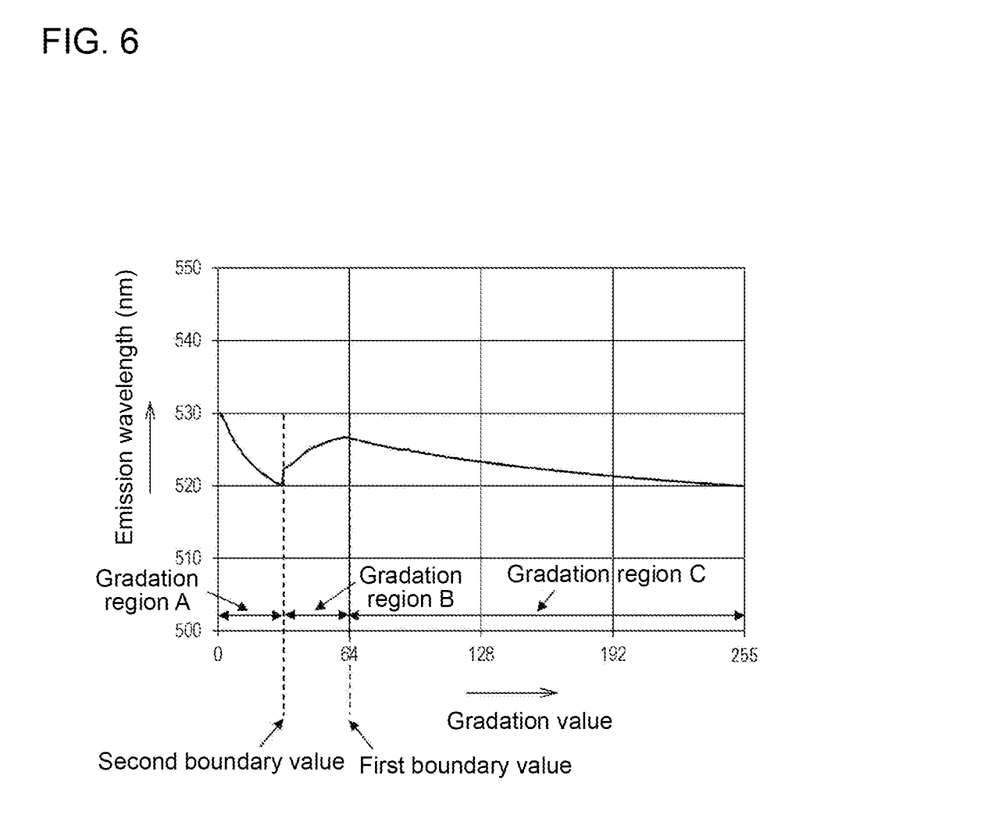
FIG. 6 is a graph showing the relationship between a gradation value and the emission wavelength of a light-emitting element when the light-emitting element is driven with a composite drive signal of a drive signal for a first driver and a drive signal for a second driver in a boundary region between a low-gradation value and a high-gradation value.

In the intermediate-gradation region in which the gradation value is greater than the second boundary value and less than or equal to the first boundary value, the drive is provided to the light-emitting element 11 from both the low-gradation driver A1 and the high-gradation driver A2. As shown in FIG. 6 (described later), the discontinuous changes in the emission wavelength of the light-emitting element 11 can be reduced at the boundary between the low-gradation and high-gradation regions, or more specifically, in the intermediate-gradation region in which the gradation value is greater than the second boundary value and less than or equal to the first boundary value, and the variations in the light emission chromaticity can be reduced.

The operation of the display device 10 will now be described.

Figure 5:
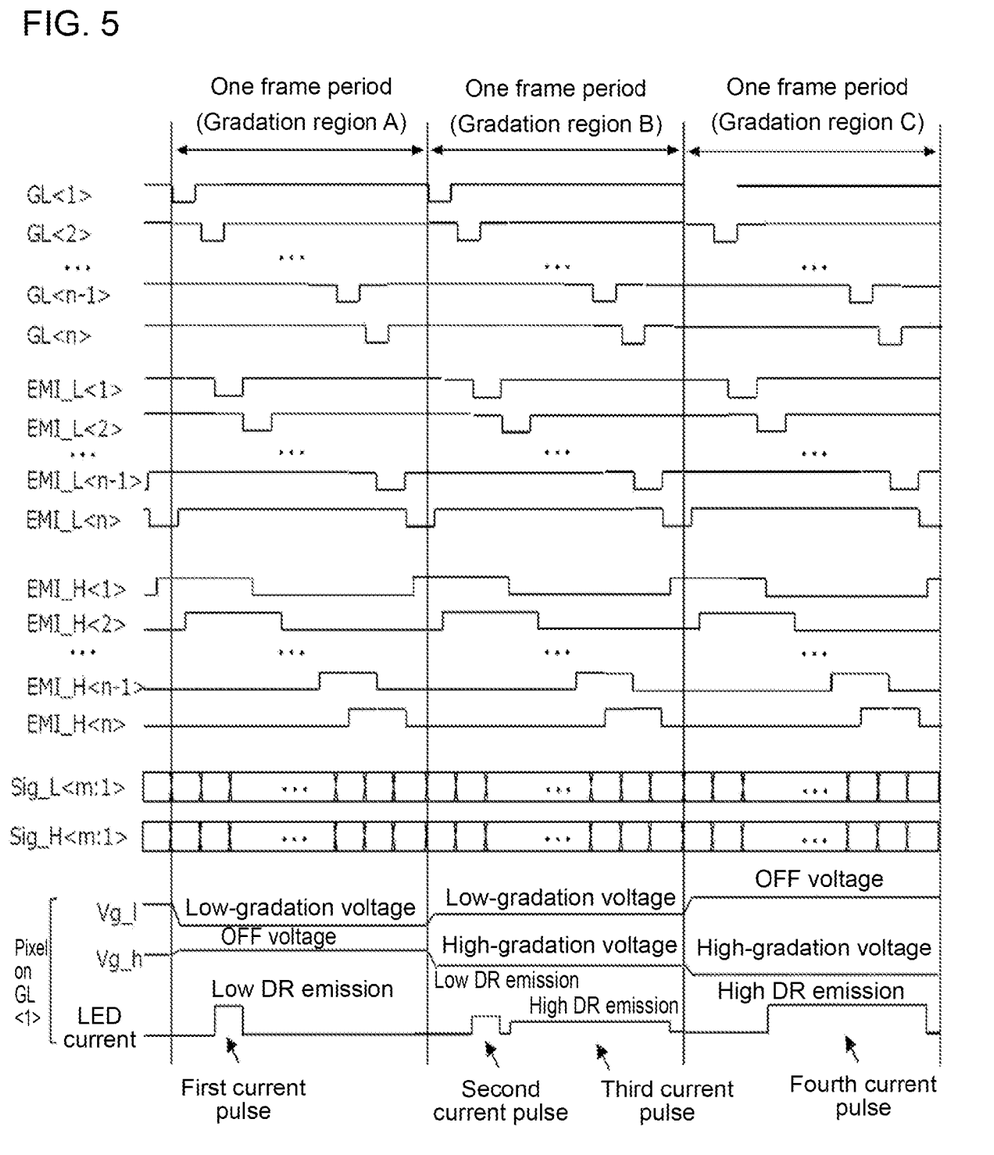
FIG. 5 is a timing chart describing the operation of the display device illustrated in FIG. 1.

FIG. 5 is a timing chart describing the operation of the display device illustrated in FIG. 1. The multiple pixel units 12 arranged in a matrix of n rows and m columns have the same configuration. The operation of one pixel on the scanning lines GL (L) (1) and GL (H) (1) will now be described as an example. The signal line drive circuit 14 and the scanning line drive circuit 15 receive a total of two image signals for the low gradation and the high gradation per pixel. The low-gradation scanning line GL (L) is activated, and writing to the low-gradation drive transistor Td (L) is performed. The high-gradation scanning line GL (H) is then activated and writing data to the high-gradation drive transistor Td (H) is performed. The data to be written is provided from the data signal line Sig to the low-gradation drive transistor Td (L) and to the high-gradation drive transistor Td (H) alternately in a time-divided manner.

In response to the light-emitting element 11 emitting light in a gradation region C (a high-gradation region in which the gradation value is greater than the first boundary value), the high-gradation drive voltage Vg (H) is provided to the high-gradation drive transistor Td (H), and the OFF voltage Vg (L) is provided to the low-gradation drive transistor Td (L). In response to the light-emitting element 11 emitting light in a gradation region A (a low-gradation region in which the gradation value is less than or equal to the second boundary value), the low-gradation drive voltage Vg (L) is provided to the low-gradation drive transistor Td (L), and an OFF voltage Vg (H) is provided to the high-gradation drive transistor Td (H). In response to the light-emitting element 11 emitting light in a gradation region B (an intermediate-gradation region in which the gradation value is greater than the second boundary value and less than or equal to the first boundary value), the low-gradation drive voltage Vg (L) is provided to the low-gradation drive transistor Td (L), and the high-gradation drive voltage Vg (H) is provided to the high-gradation drive transistor Td (H). For light emission control, a pulse signal for a light emission period of a low duty ratio (a pulse signal for the first current pulse or a pulse signal for the second current pulse) is input into the low-gradation emission control line EMI (L), and a pulse signal for a light emission period of a high duty ratio (a pulse signal for the third current pulse or a pulse signal for the fourth current pulse) is input into the high-gradation emission control line EMI (H) to output a current pulse to the light-emitting element 11.

The drive signal, as shown in FIG. 3 described above, causes the low-gradation driver A1 to drive the light-emitting element 11 at a low-gradation voltage in response to the gradation value obtained from the image signal being in the range less than or equal to the first boundary value and not to drive the light-emitting element 11 in response to the gradation value obtained from the image signal being in the range greater than the first boundary value. The high-gradation driver A2 does not drive the light-emitting element 11 in response to the gradation value obtained from the image signal being in the range less than or equal to the second boundary value and drives the light-emitting element 11 at a high-gradation voltage in response to the gradation value obtained from the image signal being in the range greater than the second boundary value. In the region in which the gradation value obtained from the image signal is greater than the second boundary value and less than or equal to the first boundary value, the light-emitting element 11 is continuously driven by both the low-gradation driver A1 and the high-gradation driver A2 in a time-divided manner during the one frame period.

The light-emitting element 11 is thus driven simply with the drive signal from the low-gradation driver A1 in response to the gradation value obtained from the image signal being less than or equal to the second boundary value, and simply with the drive signal from the high-gradation driver A2 in response to the gradation value obtained from the image signal being greater than the first boundary value. In response to the gradation value obtained from the image signal being greater than the second boundary value and less than or equal to the first boundary value, the light-emitting element 11 is driven with a composite drive signal of the drive signal for the low-gradation driver A1 and the drive signal for the high-gradation driver A2.

FIG. 6 is a graph showing the relationship between the gradation value and the emission wavelength of the light-emitting element 11 when the light-emitting element 11 is driven with a composite drive signal of the drive signal for the low-gradation driver A1 and the drive signal for the high-gradation driver A2 in the boundary region between the low gradation and the high gradation (the gradation region in which the gradation value is greater than the second boundary value and less than or equal to the first boundary value). To achieve a high contrast ratio as in the display device 10 according to the present embodiment, the light-emitting element 11 is to be driven over a wide luminance range. In the present embodiment, the light emission pulse period of the low-gradation driver A1 has a lower duty ratio than the light emission pulse period of the high-gradation driver A2, for example in the range of 0.1 to 10% to be driven with a high wave height value to increase the current flowing to the light-emitting element 11 in the low-gradation region. This allows stable light emission luminance to be obtained easily in the low current region in which the light emission efficiency of the light-emitting element 11 is low and the characteristic variations are large without using the light-emitting element 11 for a long time during the one frame period. The current range of the light-emitting element 11 to all the gradation values can be narrower, such as about 0.01 to 1.0 (a relative value) to reduce changes in light emission chromaticity that depend on the current flowing to the light-emitting element 11. In other words, the variation range in the emission wavelength in the range of all the gradation values of 0 to 255 can be reduced and be narrower. Further, driving in the boundary region between the low gradation and high gradation (the intermediate-gradation region) with a composite drive signal of the drive signal for the low-gradation driver A1 and the drive signal for the high-gradation driver A2 can reduce the discontinuous changes in the current flowing to the light-emitting element 11 in the boundary region to reduce the discontinuous changes in the emission wavelength depending on the current flowing to the light-emitting element 11.

The display device according to one or more embodiments of the present disclosure includes the multiple substrates 1 including the multiple light-emitting elements 11 as illustrated in FIG. 1, vertically and horizontally arranged on the same surface with their side surfaces joined (tiled) together with an adhesive to form a composite and large display device, or a multi-display. Such a large display device can reduce discontinuous changes in the emission wavelength due to the current dependence of the light-emitting elements to allow high definition images to be displayed with a high contrast ratio.

Figure 7:
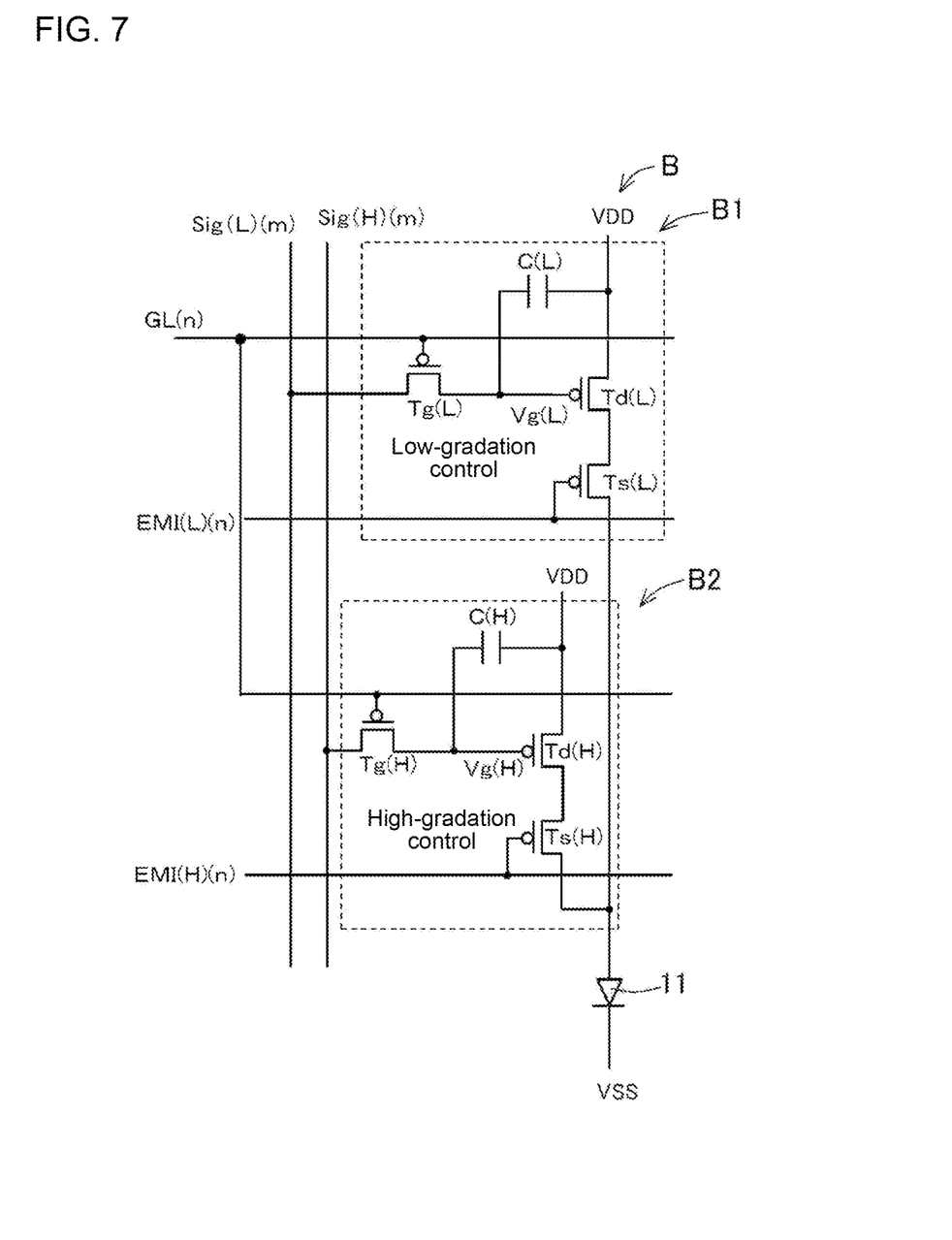
FIG. 7 is an electrical circuit diagram of a pixel unit in the display device in FIG. 1 illustrating another configuration.

FIG. 7 is an electrical circuit diagram of the pixel unit in the display device according to one or more embodiments of the present disclosure illustrating another configuration. The components corresponding to those in the above embodiment are given like reference numerals.

The display device 10 according to the present embodiment may have the structure described below. The display device 10 includes m low-gradation data signal lines Sig (L) (1) to (m), which are collectively referred to as data signal lines Sig (L), arranged for the each column in the matrix of the multiple pixel units 12, the first power supply line VDD to receive the power supply power, the second power supply line VSS to receive a voltage with a potential less than the potential of the first power supply line VDD (e.g., a predetermined positive potential), for example, a predetermined negative potential or a ground potential, and m high-gradation data signal lines Sig (H) (1) to (m), which are collectively referred to as data signal lines Sig (H), arranged for the each column in the matrix of the multiple pixel units 12, n scanning lines GL (1) to (n) (collectively referred to as scanning lines GL) for the each row in the matrix, n low-gradation emission control lines EMI (L) for the each row in the matrix, n high-gradation emission control lines EMI (H) for the each row in the matrix, the signal line drive circuit 14 that outputs image signals to the data signal lines Sig (L) and the data signal lines Sig (H), and the scanning line drive circuit 15 that outputs selection signals to the scanning lines GL. When the second power supply line VSS has the ground potential, a pixel circuit A1 and its peripheral circuit operate at substantially one potential (a positive potential). This easily simplifies the circuit configuration.

Each pixel unit 12 may have the structure described below as illustrated in FIG. 7. Each pixel unit 12 includes a pixel circuit B. The pixel circuit B includes a low-gradation driver B1 and a high-gradation driver B2. The low-gradation driver B1 includes the low-gradation scanning transistor Tg (L) with a gate terminal connected to the scanning line GL and with a source terminal connected to the low-gradation data signal line Sig (L), the low-gradation capacitor C (L) with one terminal connected to the drain terminal of the low-gradation scanning transistor Tg (L) and the other terminal connected to the first power supply line VDD, the low-gradation drive transistor Td (L) with a gate terminal connected to one terminal of the low-gradation capacitor C (L) and with a source terminal connected to the first power supply line VDD, and the low-gradation emission control transistor Ts (L) with a gate terminal connected to the low-gradation emission control line EMI (L), with a drain terminal connected to an anode electrode of the light-emitting element 11, and with a source terminal connected to a drain terminal of the low-gradation drive transistor Td (L).

The high-gradation driver B2 includes the high-gradation scanning transistor Tg (H) with a gate terminal connected to the scanning line GL and with a source terminal connected to the high-gradation data signal line Sig (H), the high-gradation capacitor C (H) with one terminal connected to the drain terminal of the high-gradation scanning transistor Tg (H) and the other terminal connected to the first power supply line VDD, the high-gradation drive transistor Td (H) with a gate terminal connected to one terminal of the high-gradation capacitor C (H) and with a source terminal connected to the first power supply line VDD, and the high-gradation emission control transistor Ts (H) with a gate terminal connected to the high-gradation emission control line EMI (H), with a drain terminal connected to the anode electrode of the light-emitting element 11, and with a source terminal connected to a drain terminal of the high-gradation drive transistor Td (H).

The light-emitting element 11 is connected in series between the drain terminal of the low-gradation emission control transistors Ts (L) and the second power supply line VSS and between the drain terminal of the high-gradation emission control transistor Ts (H) and the second power supply line VSS. In other words, the anode electrode of the light-emitting element 11 is connected in parallel to the drain terminals of the low- and high-gradation emission control transistors Ts (L) and Ts (H). The cathode electrode of the light-emitting element 11 is connected to the second power supply line VSS.

In the present embodiment as well, similarly to the above embodiment in FIGS. 1 and 2, two sets of the drive transistors Td (L) and Td (H) and the emission control transistors Ts (L) and Ts (H) for the low gradation and the high gradation are included. Outputs from these transistors are combined to drive the light-emitting element 11 as in the above embodiment. In the present embodiment, however, data signals are provided to the low- and high-gradation drive transistors Td (L) and Td (H) at the same timing using the two data signal lines, or the signal line Sig (L) for the low gradation and the signal line Sig (H) for the high gradation, and the single scanning line GL. In other words, the low-gradation driver B1 and the high-gradation driver B2 included in the pixel circuit B are simultaneously selected and driven. This allows the light-emitting element 11 to be driven at a high frame frequency. The single scanning signal (gate signal) causes data signals to be simultaneously provided to the two drive transistors, or the drive transistor Td (L) for the low gradation and the drive transistor Td (H) for the high gradation. This reduces the write time per frame as compared with when the data signals for the low gradation and for the high gradation are provided sequentially.

For example, in response to the gradation value obtained from the image signal being in the gradation range in which the gradation value is greater than the second boundary value and less than or equal to the first boundary value, the low-gradation driver B1 drives the light-emitting element 11 with the second current pulse, and the high-gradation driver B2 drives the light-emitting element 11 with the third current in a time-divided manner with the second current pulse, without switching between the low-gradation driver B1 and the high-gradation driver B2 to shorten the write time per frame.

The display device according to one or more embodiments of the present disclosure includes the multiple substrates 1 including the multiple light-emitting elements 11 as illustrated in FIG. 1, which are vertically and horizontally arranged on the same surface with their side surfaces joined together with an adhesive to form a composite and large display device, or a multi-display.

The display device according to one or more embodiments of the present disclosure can drive the light-emitting elements at a high current in the low-gradation region to reduce the likelihood of operating the light-emitting elements in a region with low light emission efficiency and large variations in characteristics. This allows high contrast ratio and high quality images to be displayed. In response to the gradation value obtained from the image signal being greater than the second boundary value and less than or equal to the first boundary value, the light-emitting element is driven with a composite drive signal of the drive signal for the low-gradation driver and the drive signal for the high-gradation driver. For the light-emitting elements with current dependence in the emission wavelength, this structure reduces the discontinuous changes in the emission wavelength near the boundary between the low-gradation region and the high-gradation region and enables display of high contrast ratio and high quality images.

The display device according to one or more embodiments of the present disclosure may be implemented in the following aspects (1) to (9) in the above embodiments.

(1) The maximum current value at which the low-gradation drivers A1 and B1 drive the light-emitting element 11 may be greater than or equal to the maximum current value at which the high-gradation drivers A2 and B2 drive the light-emitting element 11. In this case, the light-emitting element can be driven in a higher current range in the low-gradation range. This reduces the likelihood of the light-emitting element being operated in a low current range with low light emission efficiency and large variations in characteristics and enables display of higher contrast ratio and higher quality images.

(2) The light-emitting element 11 may change its light emission chromaticity in accordance with the magnitude of the current. In this case, the low-gradation drivers A1 and B1 and the high-gradation drivers A2 and B2 can be driven in a time-divided manner, and the drive currents of the low-gradation drivers A1 and B1 can be increased. This reduces the likelihood of the light-emitting element 11 being operated in a low current region in which the light emission chromaticity (emission wavelength) changes greatly. The display device according to one or more embodiments of the present disclosure is thus suitable for the light-emitting element 11 with light emission chromaticity that changes depending on the magnitude of the current.

(3) The light-emitting element 11 may be an LED. In this case, the LED can be driven at a low voltage of about 2 to 3.5 V and has a long service life. The structure of the display device according to one or more embodiments of the present disclosure is suitable for the light emission chromaticity easily changeable depending on the magnitude of the current, particularly in the low current region.

(4) The gradation value obtained from the image signal which is greater than the first boundary value and less than or equal to the second boundary value may be in the range of ⅛ to ¼ of the maximum gradation value. In this case, the gradation region in which the gradation value is greater than the first boundary value and less than or equal to the second boundary value is the intermediate-gradation region. The drive in the intermediate-gradation region is easily performed in the high current region with the drive in a time-divided manner. In the intermediate-gradation region, the light-emitting element is driven with a composite drive signal of the drive signal for the low-gradation driver and the drive signal for the high-gradation driver. For the light-emitting elements with current dependence in the emission wavelength, this structure reduces the discontinuous changes in the emission wavelength near the boundary between the low-gradation region and the high-gradation region and enables display of high contrast ratio and high quality images.

(5) The maximum gradation value may be 256, and the gradation value obtained from the image signal greater than the first boundary value and less than or equal to the second boundary value may be in the range of 32 to 64. In this case, the maximum gradation value of 256 allows highly precise representation of fine differences in color and brightness to be displayed. The gradation value obtained from the image signal greater than the first boundary value and less than or equal to the second boundary value is in the range of 32 to 64. This allows the light-emitting element to be driven easily in the low-gradation region and in the intermediate-gradation region as the high current region with the drive in a time-divided manner.

(6) The display device may include a duty ratio controller that controls a low-gradation duty ratio during the one frame period of a low-gradation light emission period W11 and a high-gradation duty ratio during the one frame period of a high-gradation light emission period W12. The duty ratio controller may control, in accordance with a luminance adjustment signal to all the multiple pixel units 12, the ratio of the low-gradation duty ratio and the high-gradation duty ratio to be constant and the low-gradation duty ratio and the high-gradation duty ratio to be changed. The duty ratio controller controls the ratio of the low-gradation duty ratio and the high-gradation duty ratio to be constant when the low-gradation duty ratio and the high-gradation duty ratio are to be changed. This structure can improve the performance of the duty ratio controller, such as the operability and the operating speed, and can also simplify the circuit configuration. In this case, the duty ratio controller may control the low-gradation duty ratio and the high-gradation duty ratio during the one frame period of the intermediate-gradation light emission period.

The duty ratio controller may be a control circuit unit included in the scanning line drive circuit 15. When the scanning line drive circuit 15 is a drive element such as an IC (integrated circuit) or an LSI (large scale integrated circuit), the duty ratio controller may be a software program stored in a RAM (random-access memory) unit or a ROM (read-only memory) unit included in the drive element. The duty ratio controller may be a drive element different from the signal line drive circuit 14 and the scanning line drive circuit 15 or may be a software program stored in the RAM unit or the ROM unit included in the drive element. The duty ratio controller may be a control circuit on an external circuit board.

(7) The display device may include a duty ratio controller that controls the low-gradation duty ratio during the one frame period of the low-gradation light emission period W11 and the high-gradation duty ratio during the one frame period of the high-gradation light emission period W12. The duty ratio controller may control, in accordance with a luminance adjustment signal to all the multiple pixel units 12, the ratio of the low-gradation duty ratio and the high-gradation duty ratio to be changed and the low-gradation duty ratio and the high-gradation duty ratio to be changed. The duty ratio controller changes the ratio of the low-gradation duty ratio and the high-gradation duty ratio when the low-gradation duty ratio and the high-gradation duty ratio are to be changed. This allows the low-gradation duty ratio and the high-gradation duty ratio to be controlled with high precision. In this case, the duty ratio controller may control the low-gradation duty ratio and the high-gradation duty ratio during the one frame period of the intermediate-gradation light emission period.

(8) The display device may include a substrate including a pixel unit surface on which the multiple pixel units 12 are arranged, an opposite surface opposite to the pixel unit surface, and a side surface, and a driver on the opposite surface to drive the low-gradation drivers A1 and B1 and the high-gradation drivers A2 and B2. In this case, the driver may not be located at the picture plane edge of the pixel area on the substrate. This allows high quality images to be displayed over a wide area. When multiple display devices include their side surfaces joined together into a composite display device, the joints are less noticeable and maintain the continuity of an image at the joints.

(9) The display device may include a substrate 2 including side wiring on its side surface. The side wiring connects the low-gradation drivers A1 and B1 and the high-gradation drivers A2 and B2 to the driver. In this case, the substrate may not include through-conductors such as through-holes that connect the low-gradation drivers A1 and B1 and the high-gradation drivers A2 and B2 to the driver. The pixel unit surface may not include the area for through-conductors. The display device uses a smaller area and thus can have a smaller size.

The display device according to one or more embodiments of the present disclosure can be used for a display device including not only LEDs as light-emitting elements but also other light-emitting elements having current dependence on the oscillation wavelength, such as organic LEDs and organic ELs as light-emitting elements.

In the display device according to one or more embodiments of the present disclosure, the light-emitting element is driven with a composite drive signal of the drive signal for the low-gradation driver and the drive signal for the high-gradation driver in response to the gradation value obtained from the image signal being greater than the second boundary value and less than or equal to the first boundary value. For the light-emitting elements having current dependence in the emission wavelength, this structure reduces the discontinuous changes in the emission wavelength near the boundary between the low-gradation region and the high-gradation region and enables display of high contrast ratio and high quality images.

INDUSTRIAL APPLICABILITY

The display device according to one or more embodiments of the present disclosure can be used in various electronic devices. Such electronic devices include composite and large display devices (multi-displays), automobile route guidance systems (car navigation systems), ship route guidance systems, aircraft route guidance systems, smartphones, mobile phones, tablets, PDAs (personal digital assistants), video cameras, digital still cameras, electronic organizers, electronic books, electronic dictionaries, personal computers, copiers, terminals for game devices, television sets, product display tags, price display tags, programmable display devices for industrial use, car audio systems, digital audio players, facsimile machines, printers, ATMs (automatic teller machines), vending machines, digital display watches, and smartwatches, and information displays installed at stations and airports.

The present disclosure may be embodied in various forms without departing from the spirit or the main features of the present disclosure. The embodiments described above are thus merely illustrative in all respects. The scope of the present disclosure is defined not by the description given above but by the claims. Any variations and alterations contained in the claims fall within the scope of the present disclosure.

| Reference Signs | |
|---|---|
| 10 | display device |
| 11 | light-emitting element |
| 12 | pixel unit |
| 13 | display screen |
| 14 | signal line drive circuit |
| 15 | scanning line drive circuit |
| A, B | pixel circuit |
| A1, B1 | low-gradation driver |
| A2, B2 | high-gradation driver |
| Sig | data signal line |
| GL(L) | low-gradation scanning line |
| GL(H) | high-gradation scanning line |
| EMI(L) | low-gradation emission control line |
| EMI(H) | high-gradation emission control line |
| VDD | first power supply line |
| VSS | second power supply line |
| Tg(L) | low-gradation scanning transistor |
| Tg(H) | high-gradation scanning transistor |
| C(L) | low-gradation capacitor |
| C(H) | high-gradation capacitor |
| Td(L) | low-gradation drive transistor |
| Td(H) | high-gradation drive transistor |
| Ts(L) | low-gradation emission control transistor |
| Ts(H) | high-gradation emission control transistor |

The invention claimed is:
1. A display device, comprising:

a plurality of pixel units arranged in a matrix, each pixel unit of the plurality of pixel units including a light-emitting element having luminance changeable in accordance with a magnitude of a current and an input period of the current, and a pixel circuit configured to cause the light-emitting element to emit light with luminance corresponding to a gradation value obtained from an image signal, wherein the pixel circuit includes
- a first driver configured to drive the light-emitting element in response to the gradation value from the image signal being in a range of gradation values less than or equal to a first boundary value, and not to drive the light-emitting element in response to the gradation value from the image signal being in a range of gradation values greater than the first boundary value, and
- a second driver configured not to drive the light-emitting element in response to the gradation value from the image signal being in a range of gradation values less than or equal to a second boundary value that is less than the first boundary value, and to drive the light-emitting element in response to the gradation value from the image signal being in a range of gradation values greater than the second boundary value.

2. The display device according to claim 1, wherein
in response to the gradation value from the image signal being in the range of gradation values less than or equal to the second boundary value, the first driver drives the light-emitting element with a first current pulse,
in response to the gradation value from the image signal being in a range of gradation values greater than the second boundary value and less than or equal to the first boundary value, the first driver drives the light-emitting element with a second current pulse, and the second driver drives the light-emitting element with a third current pulse in a time-divided manner with the second current pulse, and
in response to the gradation value from the image signal being in the range of gradation values greater than the first boundary value, the second driver drives the light-emitting element with a fourth current pulse.

3. The display device according to claim 1, wherein
the first driver and the second driver are selected and driven independently of each other.

4. The display device according to claim 3, further comprising:
- a data signal line arranged for each column in the matrix of the plurality of pixel units;
- a first power supply line to receive a power supply voltage;
- a second power supply line to receive a power supply voltage lower than the power supply voltage received by the first power supply line;
- a low-gradation scanning line arranged for each row in the matrix;
- a low-gradation emission control line arranged for the each row in the matrix;
- a high-gradation scanning line arranged for the each row in the matrix;
- a high-gradation emission control line arranged for the each row in the matrix;
- a signal line drive circuit configured to output the image signal to the data signal line; and
- a scanning line drive circuit configured to output a selection signal to the low-gradation scanning line and the high-gradation scanning line, wherein the first driver includes
- a low-gradation scanning transistor with a gate terminal connected to the low-gradation scanning line and with a source terminal connected to the data signal line,
- a low-gradation capacitor with one terminal connected to a drain terminal of the low-gradation scanning transistor and with the other terminal connected to the first power supply line,
- a low-gradation drive transistor with a gate terminal connected to the one terminal of the low-gradation capacitor and with a source terminal connected to the first power supply line, and
- a low-gradation emission control transistor with a gate terminal connected to the low-gradation emission control line, with a drain terminal connected to an anode electrode of the light-emitting element, and with a source terminal connected to a drain terminal of the low-gradation drive transistor, the second driver includes
- a high-gradation scanning transistor with a gate terminal connected to the high-gradation scanning line and with a source terminal connected to the data signal line,
- a high-gradation capacitor with one terminal connected to a drain terminal of the high-gradation scanning transistor and with the other terminal connected to the first power supply line,
- a high-gradation drive transistor with a gate terminal connected to the one terminal of the high-gradation capacitor and with a source terminal connected to the first power supply line, and
- a high-gradation emission control transistor with a gate terminal connected to the high-gradation emission control line, with a drain terminal connected to the anode electrode of the light-emitting element, and with a source terminal connected to a drain terminal of the high-gradation drive transistor, and the light-emitting element is connected between the drain terminal of the low-gradation emission control transistor and the second power supply line and between the drain terminal of the high-gradation emission control transistor and the second power supply line.

5. The display device according to claim 4, wherein the second power supply line has a ground potential.

6. The display device according to claim 1, wherein the first driver and the second driver are selected and driven simultaneously with each other.

7. The display device according to claim 6, further comprising:
- a low-gradation signal line arranged for each column in the matrix of the plurality of pixel units;
- a first power supply line to receive a power supply voltage;
- a second power supply line to receive a power supply voltage lower than the power supply voltage received by the first power supply line;
- a high-gradation signal line arranged for the each column in the matrix of the plurality of pixel units;
- a scanning line arranged for each row in the matrix;
- a low-gradation emission control line arranged for the each row in the matrix;
- a high-gradation emission control line arranged for the each row in the matrix;
- a signal line drive circuit configured to output the image signal to the low-gradation signal line and the high-gradation signal line; and
- a scanning line drive circuit configured to output a selection signal to the scanning line, wherein the first driver includes a low-gradation scanning transistor with a gate terminal connected to the scanning line and with a source terminal connected to the low-gradation signal line, a low-gradation capacitor with one terminal connected to a drain terminal of the low-gradation scanning transistor and with the other terminal connected to the first power supply line, a low-gradation drive transistor with a gate terminal connected to the one terminal of the low-gradation capacitor and with a source terminal connected to the first power supply line, and a low-gradation emission control transistor with a gate terminal connected to the low-gradation emission control line, with a drain terminal connected to an anode electrode of the light-emitting element, and with a source terminal connected to a drain terminal of the low-gradation drive transistor, the second driver includes a high-gradation scanning transistor with a gate terminal connected to the scanning line and with a source terminal connected to the high-gradation signal line, a high-gradation capacitor with one terminal connected to a drain terminal of the high-gradation scanning transistor and with the other terminal connected to the first power supply line, a high-gradation drive transistor with a gate terminal connected to the one terminal of the high-gradation capacitor and with a source terminal connected to the first power supply line, and a high-gradation emission control transistor with a gate terminal connected to the high-gradation emission control line, with a drain terminal connected to the anode electrode of the light-emitting element, and with a source terminal connected to a drain terminal of the high-gradation drive transistor, and the light-emitting element is connected between the drain terminal of the low-gradation emission control transistor and the second power supply line and between the drain terminal of the high-gradation emission control transistor and the second power supply line.

8. The display device according to claim 7, wherein the second power supply line has a ground potential.

9. The display device according to claim 1, wherein a duty ratio during one frame period of a low-gradation light emission period in which the first driver performs a low-gradation light emission operation is smaller than a duty ratio during the one frame period of a high-gradation light emission period in which the second driver performs a high-gradation light emission operation.

10. The display device according to claim 9, wherein the duty ratio during the one frame period of the low-gradation light emission period is 0.1 to 10%.

11. The display device according to claim 1, wherein a maximum current value at which the first driver drives the light-emitting element is greater than or equal to a maximum current value at which the second driver drives the light-emitting element.

12. The display device according to claim 1, wherein the light-emitting element changes light emission chromaticity in accordance with the magnitude of the current.

13. The display device according to claim 12, wherein the light-emitting element is a light-emitting diode.

14. The display device according to claim 1, wherein a gradation value greater than the first boundary value and less than or equal to the second boundary value is in a range of ⅛ to ¼ of a maximum gradation value.

15. The display device according to claim 14, wherein the maximum gradation value is 256, and the gradation value greater than the first boundary value and less than or equal to the second boundary value is in a range of 32 to 64.

16. The display device according to claim 9, further comprising:

a duty ratio controller configured to control a low-gradation duty ratio during the one frame period of the low-gradation light emission period and a high-gradation duty ratio during the one frame period of the high-gradation light emission period, the duty ratio controller further configured to control, in accordance with a luminance adjustment signal to all of the plurality of pixel units, a ratio of the low-gradation duty ratio and the high-gradation duty ratio to be constant, and to change the low-gradation duty ratio and the high-gradation duty ratio.

17. The display device according to claim 9, further comprising:

a duty ratio controller configured to control a low-gradation duty ratio during the one frame period of the low-gradation light emission period and a high-gradation duty ratio during the one frame period of the high-gradation light emission period, the duty ratio controller further configured to control, in accordance with a luminance adjustment signal to all of the plurality of pixel units, a ratio of the low-gradation duty ratio and the high-gradation duty ratio to be changed, and to change the low-gradation duty ratio and the high-gradation duty ratio.

18. The display device according to claim 1, further comprising:

a substrate including a pixel unit surface on which the plurality of pixel units is arranged, an opposite surface opposite to the pixel unit surface, and a side surface; and a driver on the opposite surface, the driver being configured to drive the first driver and the second driver.

19. The display device according to claim 18, wherein the substrate includes side wiring on the side surface, and the side wiring connects the first driver and the second driver to the driver.

20. A composite display device, comprising:

a plurality of display devices according to claim 1, the plurality of the display devices including side surfaces joined together.

* * * * *